United States Patent
Huang et al.

(10) Patent No.: US 7,060,628 B2
(45) Date of Patent: Jun. 13, 2006

(54) METHOD FOR FABRICATING A HARD MASK POLYSILICON GATE

(75) Inventors: Ming-Jie Huang, Hsinchu (TW); Yuan-Hung Chiu, Taipei (TW); Hun-Jan Tao, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/804,449

(22) Filed: Mar. 19, 2004

(65) Prior Publication Data

US 2005/0208773 A1    Sep. 22, 2005

(51) Int. Cl.
*H01L 21/302* (2006.01)

(52) U.S. Cl. .................. 438/714; 438/719; 438/725; 438/734; 438/736

(58) Field of Classification Search ........... 438/714, 438/719, 725, 734, 736
See application file for complete search history.

(56) References Cited

U.S. PATENT DOCUMENTS

| | | | | |
|---|---|---|---|---|
| 5,851,926 A * | 12/1998 | Kumar et al. | ............... | 438/714 |
| 6,037,266 A * | 3/2000 | Tao et al. | ................... | 438/719 |
| 6,156,629 A * | 12/2000 | Tao et al. | ................... | 438/535 |
| 6,156,632 A * | 12/2000 | Schuegraf | ................... | 438/592 |
| 6,399,515 B1 * | 6/2002 | Tao et al. | ................... | 438/734 |
| 6,417,084 B1 * | 7/2002 | Singh et al. | ................ | 438/585 |
| 6,573,188 B1 * | 6/2003 | Lai et al. | ..................... | 438/700 |
| 6,638,818 B1 * | 10/2003 | Crenshaw et al. | .......... | 438/255 |
| 6,828,237 B1 * | 12/2004 | Chan et al. | ................. | 438/695 |
| 2004/0152331 A1 * | 8/2004 | Xu et al. | .................... | 438/719 |
| 2004/0175950 A1 * | 9/2004 | Puppo et al. | ............... | 438/691 |

* cited by examiner

*Primary Examiner*—George A. Goudreau
(74) *Attorney, Agent, or Firm*—Tung & Assoc.

(57) ABSTRACT

A method for forming a patterned silicon-containing layer is disclosed. The method includes providing a substrate, providing a polysilicon layer on the substrate, providing a hard mask layer on the polysilicon layer, patterning and etching the hard mask layer and etching the polysilicon layer according to the pattern of the hard mask layer using a fluorine-containing etchant gas. The resulting sidewall profile of the etched polysilicon layer is substantially straight, uniform and devoid of a necking or notched configuration.

13 Claims, 2 Drawing Sheets

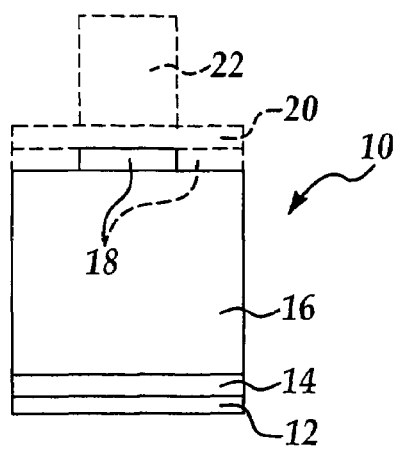
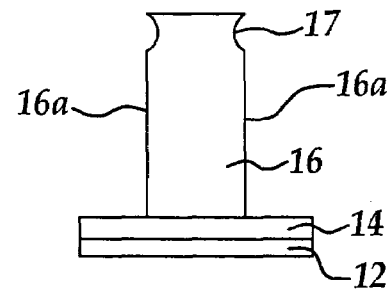
*Figure 1A*
*Prior Art*
*Figure 1B*
*Prior Art*
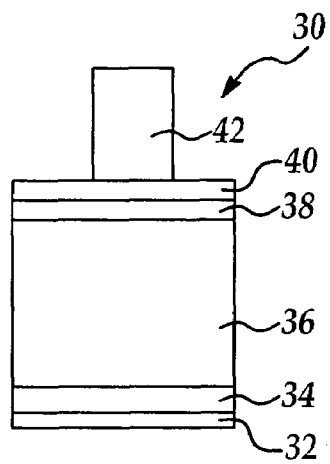 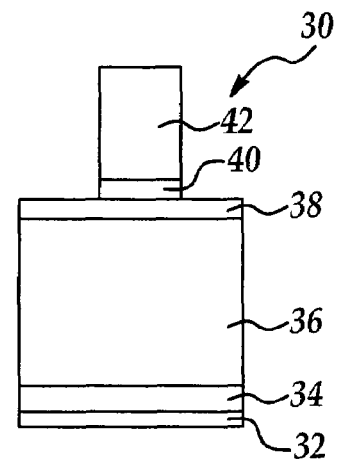 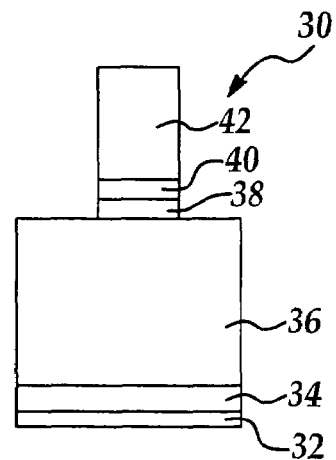
*Figure 2A*　　*Figure 2B*　　*Figure 2C*
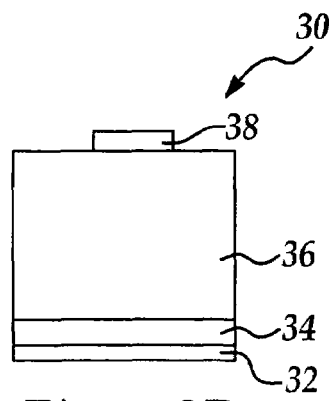 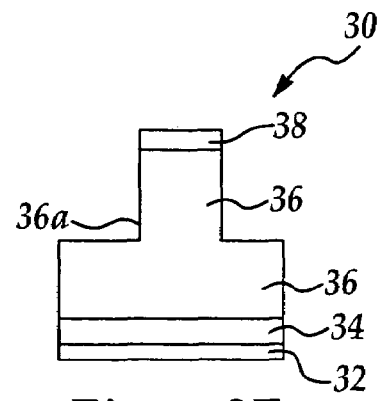 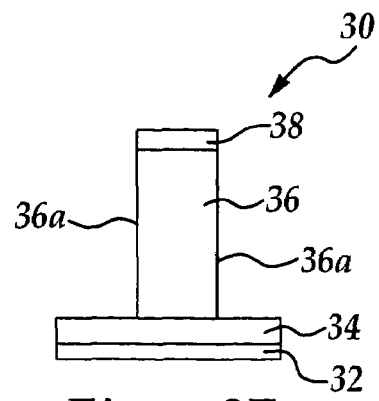
*Figure 2D*　　*Figure 2E*　　*Figure 2F*

METHOD FOR FABRICATING A HARD MASK POLYSILICON GATE

FIELD OF THE INVENTION

The present invention relates generally to fabrication of polysilicon gates in a semiconductor device. More particularly, the present invention relates to a method for fabricating a hard mask polysilicon gate using a fluorine-based etch followed by a non-fluorine based etch, to eliminate a necking profile from the polysilicon gate.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

In the semiconductor industry, CMOS (complementary metal-oxide semiconductor) technology is extensively used in the fabrication of IC devices. CMOS technology typically involves the use of overlying layers of semiconductor material with the bottom layer being a dielectric layer and the top layer being a layer of doped silicon material that serves as a low-resistivity electrical contact gate electrode. The gate electrode, also referred to as a gate stack, typically overlies the dielectric layer.

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 n anometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

As microelectronic fabrication integration levels have increased and patterned microelectronic conductor layer dimensions have decreased, it has become increasingly important within the art of microelectronic fabrication to form within microelectronic fabrications patterned microelectronic conductor layers, such as but not limited to gate electrodes within field effect transistors (FETs), as well as patterned microelectronic conductor interconnect layers, with a uniform sidewall profile. Uniform sidewall profiles are particularly desirable within gate electrodes in field effect transistors since gate electrode linewidth and profile define operational parameters of the integrated circuit within which is formed the FET. While a uniform sidewall profile is thus desirable in gate electrodes and other structures in IC devices, uniform sidewalls are, in many cases, not readily achievable.

A typical conventional process for patterning a polysilicon gate using a hard mask is shown in FIGS. 1A and 1B. A multi-layered semiconductor structure 10, shown in FIG. 1A, is initially fabricated on a substrate 12 by sequentially depositing a gate oxide layer 14, a polysilicon layer 16, a hard mask layer 18, a bottom anti-reflective coating (BARC) layer 20, and a resist layer 22 on the substrate 12. Next, the BARC layer 20 and the hard mask layer 18 are etched according to the patterned PR layer 22. This is followed by stripping of the PR layer 22 and the underlying BARC layer 20 from the patterned hard mask layer 18, to form the portion of the structure 10 which is defined by the solid lines in FIG. 1A.

Next, the polysilicon layer 16 is etched according to the patterned hard mask layer 18. This step typically involves etching of the polysilicon layer 16 using a gas mixture including chlorine, oxygen, helium and bromine. Accordingly, the polysilicon layer 16, which is etched according to the hard mask layer 18, remains on the gate oxide layer 14, as shown in FIG. 1B.

As further shown in FIG. 1B, a problem which frequently results in the etching of the polysilicon layer 16 using a chlorine-based etchant gas mixture is that a neck 17 forms in the upper end portion of the polysilicon layer 16. This necking or notched profile is undesirable since optimum semiconductor fabrication requires that the sidewalls 16a of the etched polysilicon layer 16 be as straight and uniform as possible. Accordingly, a novel method is needed for the fabrication of a polysilicon gate in such a manner that the incidence of a necking or notched configuration formed in the polysilicon gate layer is eliminated or at least substantially reduced.

An object of the present invention is to provide a novel method for fabricating a polysilicon gate.

Another object of the present invention is to provide a novel method for fabricating a polysilicon gate using a hard mask.

Still another object of the present invention is to provide a novel method for fabricating a polysilicon gate having substantially uniform sidewalls.

A still further object of the present invention is to provide a novel polysilicon gate fabrication method which eliminates or at least substantially reduces the incidence of a necking or notched profile in polysilicon gate layers.

Yet another object of the present invention is to provide a novel polysilicon gate fabrication method which includes patterning a hard mask on a polysilicon layer and etching the polysilicon layer according to the patterned hard mask using a fluorine-based etchant gas.

Another object of the present invention is to provide a novel polysilicon gate fabrication method which may include patterning a hard mask on a polysilicon layer and etching the polysilicon layer in a two-step etch process.

Still another object of the present invention is to provide a novel polysilicon gate fabrication method which may include etching of a polysilicon layer using a fluorine-based etchant gas followed by etching of the polysilicon layer using a non-fluorine-based etchant gas to eliminate or at least substantially reduce the tendency to form a necking profile in the polysilicon layer.

SUMMARY OF THE INVENTION

In accordance with these and other objects and advantages, the present invention is generally directed to a novel method for fabricating a polysilicon gate on a substrate. The method includes fabricating a multi-layered semiconductor structure including a substrate on which is sequentially fabricated a gate oxide layer, a polysilicon layer, a hard mask layer, and a resist layer which may include a bottom anti-reflective coating (BARC) layer. The hard mask layer is etched according to the patterned resist layer, after which the resist layer is stripped from the mask layer. Using a fluorine-based etchant gas mixture, the polysilicon layer is then etched according to the mask layer. The resulting sidewall profile of the etched polysilicon layer is substantially straight, uniform and devoid of a necking or notched configuration.

In accordance with the present invention, the polysilicon layer may be etched according to a two-step etch process. In the first etching step, the polysilicon layer is partially etched using a fluorine-based etchant gas. In the second etching step, etching of the polysilicon layer is completed using a non-fluorine-based etchant gas. The non-fluorine-based etchant gas may be an etchant gas mixture which includes chlorine, oxygen, helium and bromine, for example.

BRIEF DESCRIPTION OF THE DRAWINGS

The invention will now be described, by way of example, with reference to the accompanying drawings, in which:

FIGS. 1A and 1B are cross-sectional views of a multi-layered semiconductor structure, illustrating a typical conventional technique for fabricating a polysilicon gate;

FIGS. 2A–2F are cross-sectional views of a multi-layered semiconductor structure, illustrating fabrication of a polysilicon gate according to the method of the present invention.

DETAILED DESCRIPTION OF THE INVENTION

Figure 3:
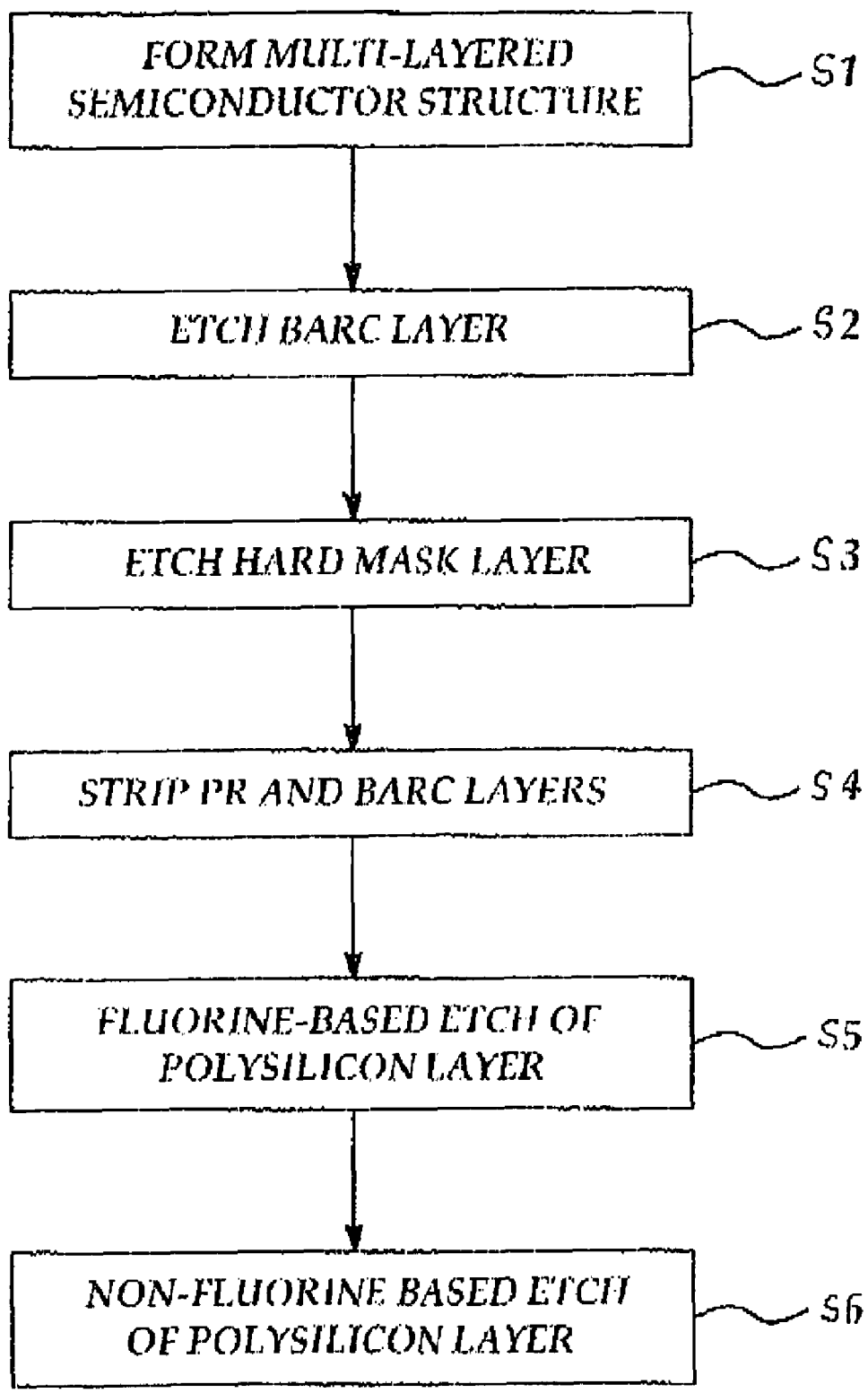
FIG. 3 is a flow diagram illustrating a typical flow of sequential process steps according to the method of the present invention.

The present invention contemplates a novel method for fabricating a polysilicon gate on a substrate. According to the method, a multi-layered semiconductor structure is initially fabricated on a substrate. The multi-layered semiconductor structure typically includes a substrate, a gate oxide layer provided on the substrate, a polysilicon layer provided on the gate oxide layer, a hard mask layer provided on the polysilicon layer, and a resist layer provided on the hard mask layer. A bottom anti-reflective coating (BARC) layer may be provided between the hard mask layer and the resist layer.

After fabrication of the multi-layered semiconductor structure, the hard mask layer is etched according to the patterned resist layer. The resist layer is then stripped from the mask layer. The polysilicon layer is then etched according to the mask layer, an etchant gas mixture which includes fluorine. The fluorine-based etching process imparts a substantially uniform sidewall profile, which is substantially devoid of a necking or notched configuration, to the etched polysilicon gate layer.

In accordance with the present invention, the polysilicon layer may be etched according to a two-step etch process, in which etching of the layer is begun in the first step and completed in the second step. The first etching step is carried out using a fluorine-based etchant gas. The second etching step is carried out using a non-fluorine-based etchant gas, which may be an etchant gas mixture that includes chlorine, oxygen, helium and bromine, for example.

Referring next to FIGS. 2A–2F, in conjunction with the flow diagram of FIG. 3, wherein sequential process steps are carried out to fabricate a polysilicon gate according to the method of the present invention. As shown in FIG. 2A and step S1 of FIG. 3, a multi-layered semiconductor structure 30 is initially formed on a substrate 32. The multi-layered semiconductor structure 30 includes a gate oxide layer 34 deposited on the substrate 32, a polysilicon layer 36 deposited on the gate oxide layer 34, a hard mask layer 38 deposited on the polysilicon layer 36, a bottom anti-reflective coating (BARC) layer 40 optionally deposited on the hard mask layer 38, and a patterned resist layer 42 deposited on the BARC layer 40.

The substrate 32 is typically a silicon semiconductor wafer and may inclued active and passive IC devices fabricated within the wafer. Additionally or alternatively, devices may be fabricated in layers formed on the wafer. The substrate 32 may be a semiconductor wafer of any size, for example, an eight or twelve-inch diameter wafer. The gate oxide layer 34 is preferably silicon dioxide and has a thickness of typically about 10~100 angstroms.

The polysilicon layer 36 is typically a poly-crystalline layer of silicon that is deposited on the gate oxide layer 34. The polysilicon layer 36 can function as a silicon gate or can be used as an interconnection between IC devices. The polysilicon layer 36 preferably has a thickness of typically about 500~3000 angstroms. The polysilicon layer 36 may further include a $WSi_x$ or other refractory metal layer (not shown).

The polysilicon layer 36 (referred to herein as polysilicon) may be either pre-doped polysilicon or amorphous silicon. After deposition of the polysilicon layer 36 on the gate oxide layer 34, the polysilicon layer 36 may be annealed to cause diffusion of dopant ions throughout the polysilicon layer 36. The polysilicon anneal step also activates the chemical bonds between the dopant atoms and the silicon atoms in the polysilicon, such that the dopant atoms become a part of the crystalline polysilicon lattice structure in a process known as electrical activation. Alternatively, the polysilicon anneal step may be omitted.

The hard mask layer 38 is preferably silicon oxide, silicon nitride or silicon oxynitride. Most preferably, the hard mask layer 38 is silicon oxide. The hard mask layer 38 preferably has a thickness of typically about 200~3000 angstroms. The BARC layer 40 is preferably a polymer resin with photo compounds and has a thickness of typically about 200~2000 angstroms.

The resist layer 42 is formed over the BARC layer 40 and patterned, exposed and developed to form the pattern that defines the polysilicon gate and other device structures to be fabricated on the substrate 32. The resist layer 42 is preferably a DUV positive photoresist such as IBM APEX resist, IBM KRS resist, Hoechst Ax's DX-46, OCG's ARCH resists, Shinetsu, Tok, AZ or JSR. The resist layer 42 can be any photoresist material such as a negative photoresist, and preferably has a thickness of typically about 1000~10000 angstroms and a width of typically about 0.05~0.30 μm.

As shown in FIG. 2B and process step S2 of FIG. 3, the BARC layer 40 is next etched according to the patterned resist layer 42. The etching process for the BARC layer 40 is carried out typically in a high density plasma (HDP) etcher, using a transformer coupled plasma (TCP) etch reaction with bromine and oxygen. Typical process parameters for the reaction are as follows: chamber pressure (5~30 mTorr, preferably, 10 mTorr); TCP power (100~1500 W, preferably, 250 W); bias power (100~1500 W, preferably, 250 W); HBr flow rate (50~300 sccm, preferably, 50 sccm); $O_2$ flow rate (5~100 sccm, preferably, 15).

As shown in FIG. 2C and process step S3 of FIG. 3, the hard mask layer 38 is then etched according to the patterned resist layer 42. The etching process for the hard mask layer 38 is carried out typically in an HDP etcher using a TCP etch reaction with fluorocarbon (C2F6, CF4). Typical process parameters for the reaction are as follows: chamber pressure (5~30 mTorr, preferably, 10 mTorr); TCP power (100~1500 W, preferably, 300 W); bias power (100~1500 W, preferably, 250 W); $C_2F_6$ flow rate (30~300 sccm, preferably, 100 W).

As shown in FIG. 2D and process step S4 of FIG. 3, the resist layer 42 and the underlying BARC layer 40 are stripped from the polysilicon layer 36. Accordingly, the patterned and etched hard mask layer 38 remains on the upper surface of the polysilicon layer 36. The resist and BARC stripping process is carried out in an HDP chamber, typically a TCP reactor with separate source and bias control. A biased $O_2$ plasma is used to strip the BARC layer 40 from the hard mask layer 38. A small quantity of $C_2F_6$ may be added to the process to enhance stripping of the BARC layer 40, as deemed necessary. Typical process parameters for the stripping process are as follows: chamber pressure (5~80mTorr, preferably, 20 mtorr); TCP power (100~1500 W, preferably, 300 W); bias power (100~1500 W); $O_2$ flow rate (50~500 sccm, preferably, 200 sccm).

After etching of the BARC layer 40, as shown in FIG. 2B and step S2; etching of the hard mask layer 38, as shown in FIG. 2C and step S3; and stripping of the resist layer 42 and BARC layer 40, as shown in FIG. 2D and step S4, the polysilicon layer 36 is etched according to the pattern defined by the hard mask layer 38. According to the method of the present invention, a fluorine-based etchant gas is used to etch the polysilicon layer 36. Preferably, the polysilicon layer 36 is etched using a two-step etch process, which includes a partial-etch step in which a fluorine-based etchant gas is initially used to partially etch the polysilicon layer 36. This is followed by a complete-etch step in which a non-fluorine-based etchant gas is used to complete etching of the polysilicon layer 36.

Referring next to FIG. 2E and step S5 of FIG 3, in the partial-etch stop, a fluorine-based gas is used to partially etch the polysilicon layer 36 according to the pattern defined by the patterned and etched hard mask layer 38. The fluorine-based etching process is typically carried out in a high density plasma (HDP) etch chamber. The fluorine-based etchant gas may include a source gas such as fluorocarbon, fluoronitride a fluorine and nitrogen containing gas, or a fluorine and sulfur containing gas, in non-exclusive particular. Application of the fluorine-based etchant gas in the partial etch step is typically followed by the complete etch step, which utilizes an etchant gas devoid of fluorine and typically having chlorine, bromine, oxygen and helium to enhance etching profile uniformity in the sidewalls of the etched polysilicon layer 36.

Typical process parameters for the fluorine-base partial etch step S5 include a chamber pressure of typically from about 5 mTorr to typically about 80 mTorr; a source radio frequency power to from typically about 100 watts to about 1500 watts at a source radio frequency of 13.56 MHz; a bias power of from typically about 50 to typically about 1500 watts; and a fluorine-base etchant gas flow rate of typically about 100 sccm.

After the fluorine-based partial-etch step S5 is completed, the partially-etched polysilicon layer 36 of FIG. 2E is typically subjected to the non-fluorine-based complete-etch step S6, as shown in FIG. 2F. In the complete-etch step, a non-fluorine-based etchant gas, or etchant gas devoid of fluorine, is used to complete the etching of the polysilicon layer 36 which was begun in the fluorine-based partial-etch step of FIG. 2E and step S5. In the complete-etch step, etching of the polysilicon layer 36 is completed according to the pattern defined by the mask layer 38.

Like the partial-etch step S5, the complete-etch step S6 is typically carried out in a high density plasma (HDP) etch chamber. The non-fluorine-based etchant gas may include a gas mixture of chlorine, oxygen, helium and bromine, for example. After completion of the complete-etch step of the etching process, the sidewalls 36a of the etched polysilicon layer 36 are substantially uniform, vertical and devoid of a necking or notched profile which characterizes conventional hard mask polysilicon etching processes, as shown in FIG. 2F.

Typical process parameters for the non-fluorine-based complete-etch step S6 include a chamber pressure of typically about 5~30 mTorr, and preferably, about 10 mTorrs; a source radio frequency power of typically about 100~1500 watts, and preferably, about 150 watts, at a source radio frequency of 13.56 MHz; a bias power of typically about 100~1500 watts, and preferably, about 150 watts; a $Cl_2$ gas flow rate of typically about 20~500 sccm, and preferably, about 50 sccm; a He gas flow rate and an $O_2$ gas flow rate of typically about 10~500 sccm, and preferably, about 15 sccm; and an HBr gas flow rate 0f typically about 10~500 sccm, and preferably, about 150 sccm.

While the preferred embodiments of the invention have been described above, it will be recognized and understood that various modifications can be made in the invention and the appended claims are intended to cover all such modifications which may fall within the spirit and scope of the invention.

What is claimed is:

1. A method for forming a patterned silicon-containing structure to avoid notching along sidewalls of said structure, comprising:
   providing a substrate;
   providing a silicon layer on said substrate; said silicon layer comprises pre-doped polysilicon having a dopant gradient;
   providing a hard mask layer on said silicon layer;
   patterning and etching said hard mask layer;

partially etching through a first thickness of said silicon layer according to said hard mask layer without exposing the underlying substrate using a fluorine based etching chemistry; and, then etching through a remaining thickness of said silicon layer to expose said underlying substrate according to said hard mask layer using an etchant gas devoid of fluorine.

2. The method of claim 1 wherein said step of partially etching comprises a chamber pressure of from about 5 mTorr to about 80 mTorr; a source radio frequency power of from about 100 watts to about 1500 watts at a source radio frequency of 13.56 MHz; and a bias power of from about 100 watts to about 1500 watts.

3. The method of claim 1 wherein said hard mask layer is a material selected from the group consisting of silicon oxide, silicon nitride and silicon oxynitride.

4. The method of claim 1 wherein said fluorine based etching chemistry comprises a gas selected from the group consisting of a fluorocarbon gas, a fluorine and nitrogen containing gas, and a fluorine and sulfur containing gas.

5. A method for forming a gate electrode to reduce or prevent necking at an upper portion of the gate electrode, comprising the steps of:
  providing a substrate;
  forming a gate oxide layer on the substrate;
  providing a silicon layer which comprises pre-doped polysilicon having a dopant gradient of high dopant concentration in a top layer portion to a low dopant concentration in a bottom layer portion of said polysilicon layer;
  providing a hard mask layer on said silicon layer;
  patterning and etching said hard mask layer;
  subjecting said silicon layer to a first etch step using a fluorine based etching chemistry to etch through a first thickness portion of said silicon layer without exposing the gate oxide layer, said fluorine based etching chemistry comprising a fluorine containing etchant gas selected from the group consisting of a fluorocarbon, a fluorine and nitrogen containing gas, and a fluorine and sulfur containing gas; and
  then subjecting said silicon layer to a second etch step to etch through a remaining thickness portion of said silicon layer to expose said gate oxide layer using an etchant gas devoid of fluorine.

6. The method of claim 5 wherein said etchant gas devoid of fluorine comprises chlorine, oxygen, and bromine.

7. The method of claim 5 wherein said first etch step comprises a chamber pressure of from about 5 mTorr to about 80 mTorr; a source radio frequency power of from about 100 watts to about 1500 watts at a source radio frequency of 13.56 MHz; and a bias power of from about 100 watts to about 1500 watts.

8. A method for forming a gate electrode to reduce or prevent necking at an upper portion of the gate electrode, comprising the steps of:
  providing a substrate comprising an uppermost gate oxide layer;
  providing a silicon layer on said substrate, said silicon layer comprises pre-doped polysilicon having a dopant gradient of high dopant concentration in a top layer portion to a low dopant concentration in a bottom layer portion of said polysilicon layer;
  providing a hard mask layer on said silicon layer;
  providing a bottom anti-reflective coating layer on said hard mask layer;
  providing a photoresist layer on said bottom anti-reflective coating layer;
  patterning and etching said hard mask layer;
  stripping said bottom anti-reflective coating layer and said photoresist layer from said hard mask layer; and
  etching said silicon layer according to said hard mask layer in a first etch step without exposing said gate oxide layer using a fluorine based etching chemistry primarily consisting of a fluorine-containing etchant gas;
  then etching said silicon layer in a second etch step to expose said gate oxide layer using a chlorine and bromine based etching chemistry to form a gate electrode.

9. The method of claim 8 wherein said fluorine-containing etchant gas comprises a gas selected from the group consisting of a fluorocarbon gas, a fluorine and nitrogen containing gas, and a fluorine and sulfur containing gas.

10. The method of claim 1 wherein said silicon layer comprises pre-doped polysilicon having a dopant gradient of high dopant concentration in a top layer portion to a low dopant concentration in a bottom layer portion of said polysilicon layer.

11. The method of claim 1 wherein said etchant gas devoid of fluorine comprises chlorine and bromine.

12. The method of claim 1 wherein said fluorine based etching chemistry consists primarily of a fluorine-containing etchant gas.

13. The method of claim 5 wherein said fluorine based etching chemistry consists primarily of a fluorine-containing etchant gas.

* * * * *